US008803170B2

(12) United States Patent
Cai et al.

(10) Patent No.: US 8,803,170 B2
(45) Date of Patent: Aug. 12, 2014

(54) LIGHT SOURCE MODULE HAVING LEDS

(75) Inventors: Pei-Song Cai, Miaoli County (TW); Yong-Hong Liao, Taichung (TW); Tzu-Pu Lin, Taipei (TW); Yun-Yi Tien, Hsinchu (TW); Jian-Chin Liang, Hsinchu (TW)

(73) Assignee: Lextar Electronics Corporation, Hsinchu (TW)

(*) Notice: Subject to any disclaimer, the term of this patent is extended or adjusted under 35 U.S.C. 154(b) by 0 days.

(21) Appl. No.: 13/570,560

(22) Filed: Aug. 9, 2012

(65) Prior Publication Data

US 2013/0240921 A1 Sep. 19, 2013

(30) Foreign Application Priority Data

Mar. 15, 2012 (TW) ............................. 101108886 A

(51) Int. Cl.
*H01L 33/50* (2010.01)

(52) U.S. Cl.
USPC ..................................... 257/89; 257/E33.061

(58) Field of Classification Search
USPC ............................... 257/98–100, E33.061, 89
See application file for complete search history.

(56) References Cited

U.S. PATENT DOCUMENTS

| | | | | |
|---|---|---|---|---|
| 2006/0126326 | A1* | 6/2006 | Ng et al. | 362/231 |
| 2006/0197098 | A1* | 9/2006 | Aihara | 257/89 |
| 2007/0030694 | A1* | 2/2007 | Lim | 362/612 |
| 2011/0050125 | A1 | 3/2011 | Medendorp, Jr. et al. | |
| 2012/0098443 | A1* | 4/2012 | Lenk | 315/192 |
| 2012/0119640 | A1* | 5/2012 | Nishioka et al. | 313/498 |

* cited by examiner

*Primary Examiner* — Selim Ahmed
(74) *Attorney, Agent, or Firm* — Moser Taboada

(57) ABSTRACT

A light source module includes a substrate, a first LED package and a second LED package. The first and second LED packages are disposed on the substrate. The first LED package includes a first blue LED chip and a first phosphor. The first blue LED chip emits light in the range of the wavelength for blue light. The first phosphor is used to convert the wavelength of a portion of the light emitted from the first blue LED chip. The second LED package includes a second blue LED chip and a second phosphor. The second blue LED chip emits light in the range of the wavelength for blue light. The second phosphor is used to convert the wavelength of a portion of the light emitted from the second blue LED chip. The wavelength associated with the second phosphor is greater than that associated with the first phosphor.

18 Claims, 5 Drawing Sheets

LIGHT SOURCE MODULE HAVING LEDS

RELATED APPLICATIONS

This application claims priority to Taiwan Application Serial Number 101108886, filed Mar. 15, 2012, which is herein incorporated by reference.

BACKGROUND

1. Technical Field

Embodiments of the present invention generally relate to a light source module. More particularly, embodiments of the present invention relate to a light source module with LED packages.

2. Description of Related Art

In recent years, energy issues have been the focus of much attention. In order to save energy, the light emitting diode (LED), which has many advantages such as low power consumption and high efficiency, is quickly replacing incandescent light bulbs and fluorescent lamps.

Generally, a conventional LED lamp includes a plurality of blue LED chips, red LED chips and green LED chips, and they are all mounted on a substrate. Each LED chip is covered in a package and is electrically connected to a control circuit for receiving power.

However, such LED chips have different transmission spectrums and therefore may complicate the control circuit because the driving voltages thereof are different from each other. Further, LED chips with different transmission spectrums have different longevities, and thus, some LED chips may fail earlier than others, such that illuminance of the LED lamp may become poor after long use.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment of the present invention, a light source module includes a substrate, at least one first LED (light emitting diode) package and at least one second LED package. The first LED package is disposed on the substrate, and includes a first blue LED chip and a first phosphor. The first blue LED chip emits light that is the range of the wavelength for blue light. The first phosphor is used to convert the wavelength of a portion of the light emitted from the first blue LED chip. The second LED package is disposed on the substrate, and includes a second blue LED chip and a second phosphor. The second blue LED chip emits light that is in the range of the wavelength for blue light. The second phosphor is used to convert the wavelength of a portion of the light emitted from the second blue LED chip. The wavelength associated with the second phosphor is greater than the wavelength associated with the first phosphor.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
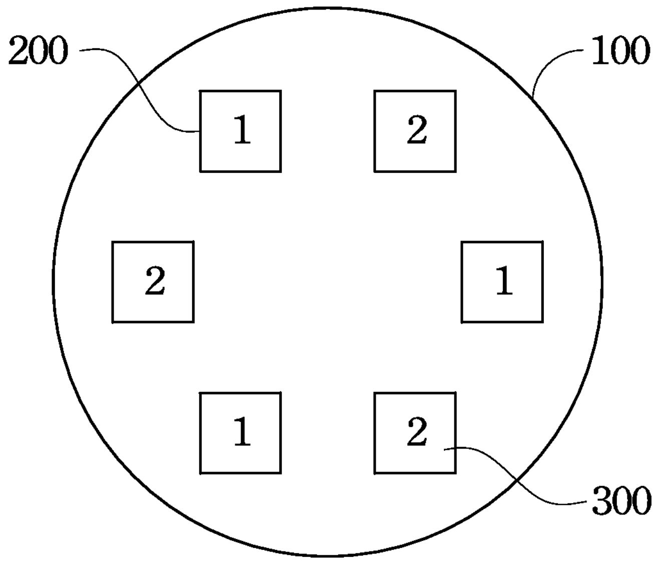
FIG. 1 is a top view of a light source module in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view of a light source module in accordance with one embodiment of the present invention. As shown in this figure, the light source module may include a substrate 100, at least one first LED (light emitting diode) package 200 and at least one second LED package 300. The first LED package 200 and the second LED package 300 are disposed on the substrate 100.

Figure 2:
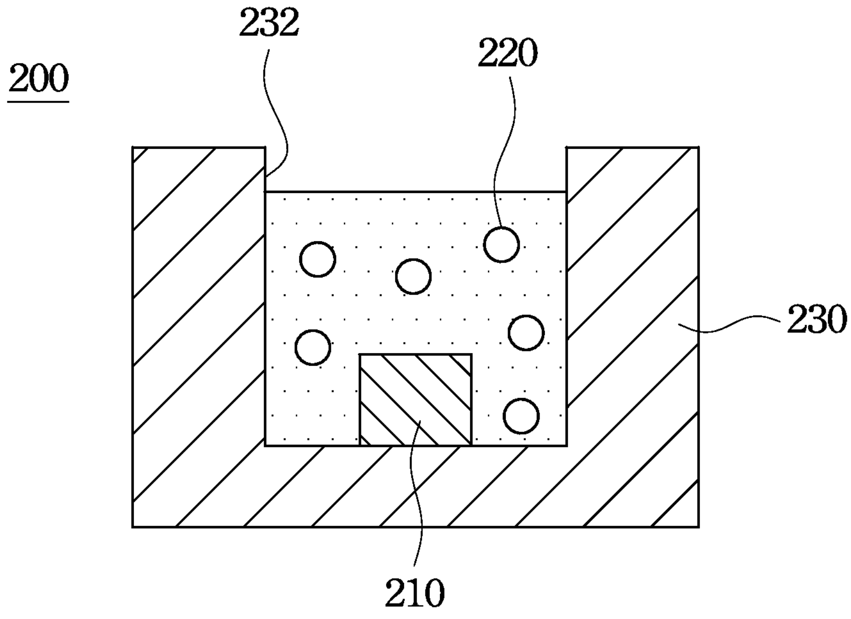
FIG. 2 is a cross-sectional view of a first LED package in accordance with one embodiment of the present invention.

FIG. 2 is a cross-sectional view of the first LED package 200 in accordance with one embodiment of the present invention. As shown in this figure, the first LED package 200 may include a first blue LED chip 210 and a first phosphor 220. The first phosphor 220 is used to convert the wavelength of a portion of light emitted from the first blue LED chip 210, and the wavelength of the rest of the light of the first blue LED chip 210 remains in the range of the wavelength for blue light.

Figure 3:
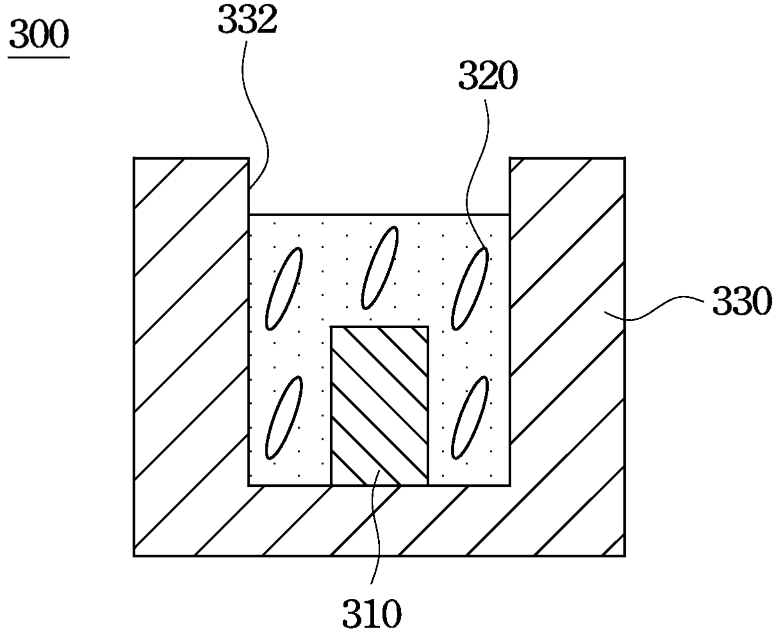
FIG. 3 is a cross-sectional view of a second LED package in accordance with one embodiment of the present invention.

FIG. 3 is a cross-sectional view of the second LED package 300 in accordance with one embodiment of the present invention. As shown in this figure, the second LED package 300 includes a second blue LED chip 310 and a second phosphor 320. The second phosphor 320 is used to convert the wavelength of a portion of light emitted from the second blue LED chip 310, and the wavelength of the rest of the light of the second blue LED chip 310 remains in the range of the wavelength for blue light. The wavelength associated with the second phosphor 320 is greater than the wavelength associated with the first phosphor 220.

The light emitted from each of the first blue LED chip 210 and the second blue LED chip 310 has a wavelength that is within the wavelength range for blue light. In some embodiments, the emission spectrum of the first blue LED chip 210 and the emission spectrum of the second blue LED chip 310 are not the same. In other embodiments, the emission spectrum of the first blue LED chip 210 and the emission spectrum of the second LED chip 310 are the same. In other words, it is necessary only that the light emitted from the first blue LED chip and the light emitted from the second blue LED chip have wavelengths that are within the wavelength for blue light, and the transmission spectrums thereof can be slightly different. Through the aforementioned configuration, the first LED package 200 and the second LED package 300 respectively include the first blue LED chip 210 and the second blue LED chip 310 that may be identical or similar to each other, so that the driving voltage may be identical or similar to each other and the control circuit may be consequently uncomplicated. Thus, the longevities of the first and second blue LED chips 210, 310 are approximately the same, so that a situation where one of first and second blue LED chips 210, 310 fails while the other continues to function properly may be avoided.

In this embodiment, a portion of the light emitted from the first blue LED chip 210 may be absorbed by the first phosphor 220 and subsequently converted to light having a wavelength that is in a different range of the visible spectrum (e.g., converted to green light). In addition to the light absorbed by the first phosphor 220, the rest of the light emitted from the first blue LED chip 210 is in the range of the wavelength for blue light. Therefore, a portion of the light emitted from the first LED package 200 has a wavelength that corresponds to the first phosphor 220, and another portion of the light has a wavelength that corresponds to the first blue LED chip 210.

Similarly, a portion of the light emitted from the second blue LED chip 310 may be absorbed by the second phosphor 320 and subsequently converted to light having a wavelength that is in a different range of the visible spectrum (e.g., converted to red light). In addition to the light absorbed by the second phosphor 320, the rest of the light emitted from the second blue LED chip 310 is in the range of the wavelength for blue light. Therefore, a portion of the light emitted from the second LED package 300 has a wavelength that corresponds to the second phosphor 320, and another portion of the light has a wavelength that corresponds to the second blue LED chip 310.

Through the aforementioned configuration, when the first phosphor 220 is green, and the second phosphor 320 is red, because the light emitted from the first blue LED chip 210 and the second blue LED chip 310 is not totally converted, the light source module can emit red, green, and blue light, thereby mixing these colors and obtaining a desired color.

In some embodiments, there is one of each of the first LED package 200 and the second LED package 300, and a ratio of light flux of the first LED package 200 to light flux of the second LED package 300 approximately ranges from 1 to 14. For example, the first phosphor 220 may be green and the second phosphor 320 may be red. When the ratio of the light flux of the first LED package 200 having the first phosphor 220 to the light flux of the second LED package 300 having the second phosphor 320 approximately ranges from 1 to 14, the light source module can achieve the desired CCT (correlated color temperature), and can further provide the strongest total light flux at the CCT. Detailed features will be described below.

It should be noted that CCT is the temperature of the Planckian radiator whose perceived color most closely resembles that of a given stimulus at the same brightness and under specified viewing conditions. (CIE/IEC 17.4:1987, International Lighting Vocabulary (ISBN 3900734070))

By adjusting a ratio of the first phosphor 220 in the first LED package 200, the light flux of the first LED package 200 can be modified. Similarly, the light flux of the second LED package 300 can be modified by adjusting a ratio of the second phosphor 320 in the second LED package 300. Therefore, the ratio of the light flux of the first LED package 200 to the light flux of the second LED package 300 can be controlled between 1 and 14 by adjusting the ratio of the first phosphor 220 and the ratio of the second phosphor 320, so that the total light flux of the light source module can be optimized under a certain CCT.

In some embodiments, there is one of each of the first LED package 200 and the second LED package 300, and the light flux of the first LED package 200 is higher than that of the second LED package 300. For example, the first phosphor 220 may be green and the second phosphor 320 may be red. Because the stimulus of green light is higher than that of red light, when the light flux of the first LED package 200 having the first phosphor 220 is higher than the light flux of the second LED package 300 having the second phosphor 320, the light source module can be perceived to be brighter.

In some embodiments, there are a plurality of each of the first LED package 200 and the second LED package 300. The ratio of total light flux of the first LED packages 200 to total light flux of the second LED packages 300 approximately ranges from 1 to 14. Specifically, when the light flux of all of the first LED packages 200 is 1-14 times to the light flux of all of the second LED packages 300, the light source module can achieve the desired CCT, and can further provide the strongest equivalent light flux under the desired CCT. In this case, the equivalent light flux can be defined as the total light flux of the light source module divided by the total number of the first LED packages 200 plus the second LED packages 300.

In some embodiments, the ratio of the number of the first LED packages 200 to the number of the second LED packages 300 approximately ranges from 0.05 to 20. The light flux of the first LED packages 200 and the light flux of the second LED packages 300 can be adjusted based on the variance of the number ratio, so as to maintain the ratio of the total light flux of the first LED packages 200 to the total light flux of the second LED packages 300 in the range from 1 to 14. Specifically, controlling the ratio of the first phosphor 220 in the first LED package 200 and the ratio of the second phosphor 320 in the second LED package 300 can respectively adjust the light flux of the first LED package 200 and the light flux of the second LED package 300.

In some embodiments, the number of the first LED packages 200 is m, and the number of the second LED packages is n, in which m and n are both positive integers. Each of the first LED packages 200 may emit a first light flux F1, and each of the second LED packages 300 may emit a second light flux F2. A total light flux of the light source module F_module is defined as the sum of the first light flux F1 multiplied by m and the second light flux F2 multiplied by n. An equivalent light flux of the light source module F_equal is defined as the total light flux of the light source module F_module divided by the sum of m and n. The first light flux F1, the second light flux F2, the number m of the first LED packages 200, and the number n of the second LED packages 300 can be chosen to optimize the equivalent light flux F_equal.

Figure 4:
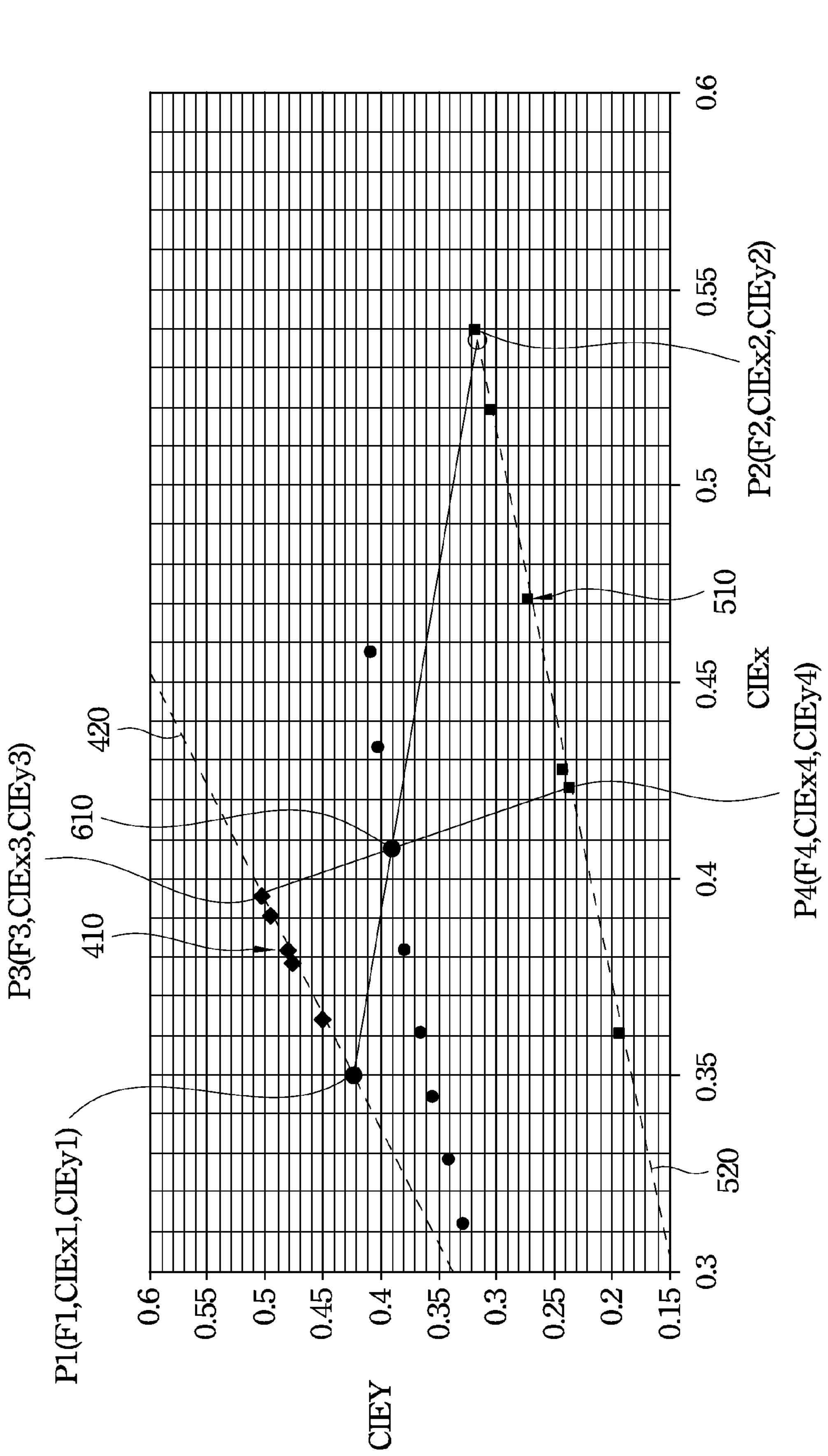
FIG. 4 is a chromaticity diagram in accordance with one embodiment of the present invention.

FIG. 4 is a chromaticity diagram in accordance with one embodiment of the present invention, and it is used to specifically explain the technical feature for optimizing the equivalent light flux F_equal of the light source module. It should be noted that the chromaticity diagram is referred to as the "CIE 1931 color space chromaticity diagram" published by CIE (International Commission on Illumination) in 1931. In this embodiment, a plurality of first CIE (CIE chromaticity diagram) coordinate points 410 are provided for the first LED package 200 based on different ratios of the first phosphor 220. A first line 420 may be drawn using these first CIE coordinate points 410, and the first line 420 is substantially straight. Similarly, a plurality of second CIE coordinate points 510 are provided for the second LED package 300 based on different ratios of the second phosphor 320. A second line 520 may be drawn using these second CIE coordinate points 510, and the second line 520 is substantially straight. The first light flux is determined by one of the first CIE coordinate points 410, and the second light flux F2 is determined by one of the second CIE coordinate points 510.

It should be noted that the term "substantially" means that any minor variation or modification not affecting the essence of the technical feature can be included in the scope of the present invention. For example, the first line 420 is described as being "substantially" straight, and this not only includes embodiments where the slope of the first line 420 is always constant, but also includes embodiments where part of the line 420 has a slightly different slope.

In order to achieve a target CIE coordinate point 610 by mixing light emitted from the first LED package 200 and the second LED package 300, myriads of the first CIE coordinate points 410 and myriads of the second CIE coordinate points 510 can be found on the first line 420 and the second line 520.

Embodiments of the present invention disclose an optimized solution from numerous first CIE coordinate points 410 and second CIE coordinate points 510 for obtaining the strongest equivalent light flux F_equal.

For example, in one solution, the first CIE coordinate point 410 of the first LED package 200 is defined as a first particular point P1, and the first light flux F1 emitted from the first Led package 200 is a function of CIEx1 (abscissa of the first particular point P1) and CIEy1 (ordinate of the first particular point P1). Similarly, the second CIE coordinate point 510 of the second LED package 300 is defined as a second particular point P2, and the second light flux F2 emitted from the second LED package 300 is a function of CIEx2 (abscissa of the second particular point P2) and CIEy2 (ordinate of the second particular point P2).

In another solution, the number of the first LED packages 200 is p, and the number of the second LED packages 300 is q. The first CIE coordinate point 410 of the first LED package 200 is defined as a third particular point P3, and the third light flux F3 emitted from the first LED package 200 is a function of CIEx3 (abscissa of the third particular point P3) and CIEy3 (ordinate of the third particular point P3). Similarly, the second CIE coordinate point 510 of the second LED package 300 is defined as a fourth particular point P4, and the fourth light flux F4 emitted from the second LED package 300 is a function of CIEx4 (abscissa of the fourth particular point P4) and CIEy4 (ordinate of the fourth particular point P4).

Based on aforementioned definitions, the equivalent light flux of these two solutions can be determined by the following formulas:

$$F\_equal\_1=(F1\times m+F2\times n)/(m+n)$$

$$F\_equal\_2=(F3\times p+F4\times q)/(p+q)$$

If F_equal_1>F_equal_2, the first particular point P1 and the second particular point P2 can be chosen as the optimized solution. In this case, a certain ratio of the first phosphor 220 corresponding to the first particular point P1 can be doped in the first LED package 200, and a certain ratio of the second phosphor 320 corresponding to the second particular point P2 can be doped in the second LED package 300. The number of the first LED packages 200 can be chosen as m, and the number of the second LED packages 300 can be chosen as n. Therefore, the equivalent light flux of the light source module F_module can be optimized.

The inventors found that when 1<F1xm/F2xn<14, the equivalent light flux of the light source module F_module of different target CIE coordinate points 610 corresponding to various CCT can be optimized.

It should be noted that the embodiment disclosed above only introduces two solutions for explanation. In practice, however, in order to realize more precision, a plurality of solutions (e.g., 1000 solutions) can be provided and compared to optimize the equivalent light flux of the light source module F_module.

In some embodiments, optimized ratios of F1xm/F2xn (namely, the ratio of the total light flux of the first LED packages 200 to the total light flux of the second LED packages 300) under some typical CCT are disclosed. This is illustrated in the chart below:

| CCT(K) | F1 × m/F2 × n medium | F1 × m/F2 × n Minimum | F1 × m/F2 × n Maximum |
|---|---|---|---|
| 2700 | 2 | 1 | 3.3 |
| 3000 | 2.7 | 1.5 | 3.9 |
| 3500 | 3.3 | 2 | 5 |
| 4000 | 4.2 | 3 | 7.1 |
| 4500 | 5.7 | 4 | 8 |
| 5000 | 6.5 | 5 | 9.5 |
| 5700 | 8.6 | 6 | 11 |
| 6500 | 10.5 | 7 | 14 |

Figure 5:
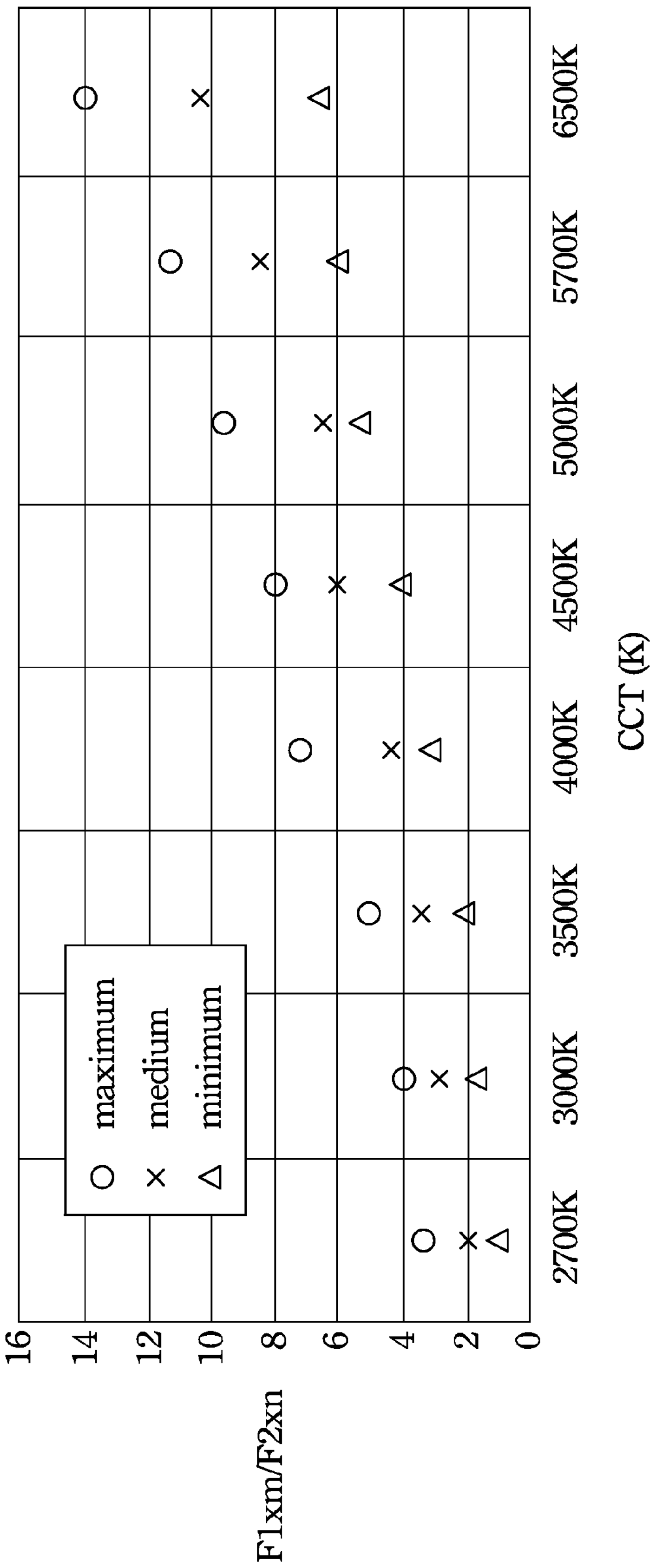
FIG. 5 is a diagram illustrating the relation between CCT and the ratio of the total light flux of the first LED packages to the total light flux of the second LED packages in accordance with one embodiment of the present invention.

Reference is also made to FIG. 5, which is a diagram illustrating the relation between CCT and F1xm/F2xn. In this diagram, the abscissa represents CCT, and the ordinate represents the value of F1xm/F2xn.

It should be noted that the term "ratio" of the phosphor disclosed herein refers to the ratio between the weight of the phosphor doped in the LED package to the weight of the phosphor that is required for totally converting the blue light of the blue LED chip. For example, if it is assumed that blue light emitted from the first blue LED chip 210 can be totally absorbed when the first LED package 200 is doped with 100 mg of the first phosphor 220, and the first LED package 200 is actually doped with 35 mg of the first phosphor 220, the "ratio" of the first phosphor 220 in this case would be 0.35.

It should also be noted that the first CIE coordinate point 410 of the first LED package 200 can gradually go rightwards on the first line 420 in the chromaticity diagram when more first phosphor 220 is doped. Similarly, the second CIE coordinate point 510 of the second LED package 300 can gradually go rightwards on the second line 520 in the chromaticity diagram when more second phosphor 320 is doped.

In some embodiments, the slope of the first line 420 is fixed and the slope of the second line 520 is also fixed.

In some embodiments, the slope of the first line 420 is greater than the slope of the second line 520.

In some embodiments, the CCT of the light source module approximately ranges from 2700K to 6500K. The aforementioned CCT corresponds to the standard of ANSI_NEMA_ANSLG C78.377-2008 or other conventional versions published by ANSI (American National Standards Institute).

Figure 6:
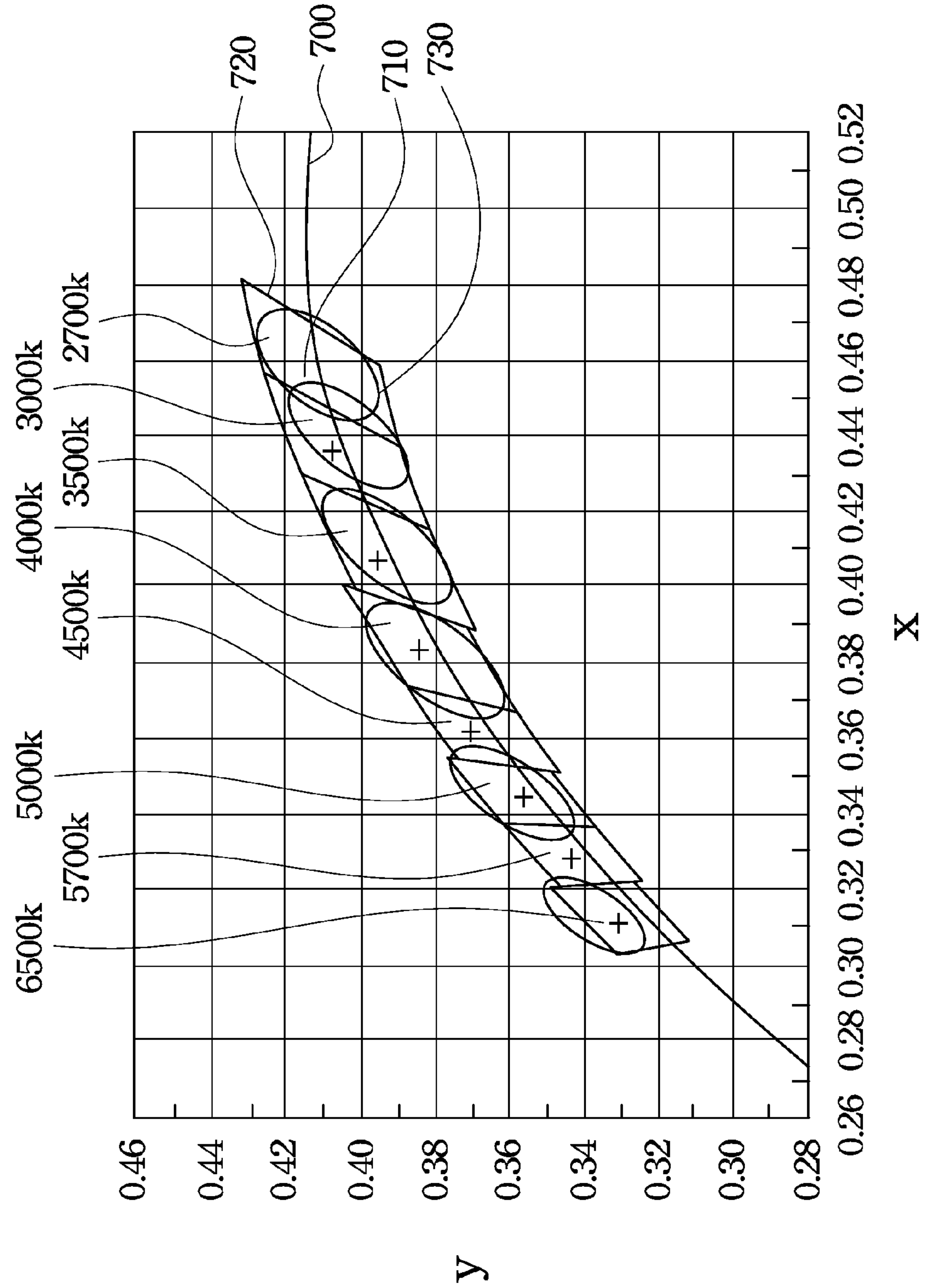
FIG. 6 is a chromaticity diagram in accordance with the standard of ANSI_NEMA_ANSLG C78.377-2008.

FIG. 6 is a chromaticity diagram in accordance with the standard of ANSI_NEMA_ANSLG C78.377-2008. As shown in this diagram, each particular CCT has an allowable range on the chromaticity diagram. For example, a CIE coordinate point 710 is provided on the Planckian Locus 700, and the corresponding CCT is 2700K. The CIE coordinate point 710 can be surrounded by one of the 7-step Chromaticity Quadrangles 720. These CIE coordinate points inside the 7-step Chromaticity Quadrangle 720 all correspond to the definition that the CCT is 2700K. Further, in eight 7-step Chromaticity Quadrangles 720, six of them overlap well-known MacAdam Ellipses 730, and two of them are defined around the CIE coordinate points of 4500K and 5700K. The CCT labeled in this diagram can be used as a nominal CCT for solid-state lighting.

A chart is provided herein to specify the relation between the nominal CCT and the color temperature.

| Nominal CCT(K) | Color Temperature(K) |
|---|---|
| 2700 | 2725 ± 145 |
| 3000 | 3045 ± 175 |
| 3500 | 3465 ± 245 |
| 4000 | 3985 ± 275 |
| 4500 | 4503 ± 243 |
| 5000 | 5028 ± 283 |
| 5700 | 5665 ± 335 |
| 6500 | 6530 ± 510 |

Referring back to FIG. 1, in some embodiments, the first LED package 200 and the second LED package 300 are symmetrically and uniformly disposed on the substrate 100. For example, a plurality of the first LED packages 200 and a plurality of the second LED packages 300 may be arranged circularly with a fixed interval between each adjacent pair of one of the first LED packages 200 and one of the second LED packages 300.

Referring to FIG. 2, the first LED package 200 may further include a first package body 230, and the first package body 230 has a recess 232. The first blue LED chip 210 may be disposed on the first package body 230 within the recess 232, and the first phosphor 220 may be filled in the recess 232 covering the first blue LED chip 210, so as to convert the blue light.

Similarly, as shown in FIG. 3, the second LED package 300 may include a second package body 330, and the second package body has a recess 332. The second blue LED chip 310 may be disposed on the second package body 330 within the recess 332, and the second phosphor 320 may be filled in the recess 332 covering the second blue LED chip 310, so as to convert the blue light.

In some embodiments, the peak wavelength associated with the first phosphor 220 approximately ranges from 510 nm to 590 nm. In some embodiments, the peak wavelength associated with the second phosphor 320 approximately ranges from 591 nm to 660 nm.

In some embodiments, a FWHM (full width at half maximum) of each of the first phosphor 220 and the second phosphor 320 approximately ranges from 60 nm to 160 nm.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light source module having LEDs and a total light flux, F module, the light source module comprising:

a substrate;

at least one first LED (light emitting diode) package disposed on the substrate, the first LED package comprising:

a first blue LED chip emitting light that is in the range of the wavelength for blue light;

a first phosphor for converting the wavelength of a portion of the light emitted from the first blue LED chip; and at least one second LED package disposed on the substrate, the second LED package comprising:

a second blue LED chip emitting light that is in the range of the wavelength for blue light; and a second phosphor for converting the wavelength of a portion of the light emitted from the second blue LED chip;

wherein the wavelength associated with the second phosphor is greater than the wavelength associated with the first phosphor;

wherein a number of the at least one first LED package is m, and a number of the at least one second LED package is n, wherein m and n are both positive integers;

wherein each of the first LED package emits a first light flux F1, and each of the second LED package emits a second light flux F2;

wherein the total light flux of the light source module, F_module, satisfies: F_module=F1×m+F2×n;

wherein an arithmetic mean of an equivalent light flux of the light source module, F_mean satisfies: F_mean=(F1×m+F2×n)/(m+n);

wherein the arithmetic mean of the equivalent light flux of the light source module, F_mean is optimized by choosing the first light flux F1, the second light flux F2, the number m of the at least one first LED package, and the number n of the at least one second LED package, wherein a plurality of first CIE (CIE chromaticity diagram) coordinate points are provided based on different ratios of the first phosphor, a first line is drawn by the first CIE coordinate points, and the first line is substantially straight;

wherein a plurality of second CIE (CIE chromaticity diagram) coordinate points are provided based on different ratios of the second phosphor, a second line is drawn by the second CIE coordinate points, and the second line is substantially straight.

2. The light source module of claim 1, wherein a ratio of a light flux of the first LED package to a light flux of the second LED package approximately ranges from 1 to 14.

3. The light source module of claim 2, wherein the light flux of the first LED package is higher than the light flux of the second LED package.

4. The light source module of claim 1, wherein there is a plurality of the first LED packages and a plurality of the second LED packages;

wherein a ratio of a total light flux of the first LED packages to a total light flux of the second LED packages approximately ranges from 1 to 14.

5. The light source module of claim 4, wherein a ratio of the number of the first LED packages to the number of the second LED packages approximately ranges from 0.05 to 20.

6. The light source module of claim 1, wherein the first light flux F1 is determined by one of the first CIE coordinate points, and the second light flux F2 is determined by one of the second CIE coordinate points.

7. The light source module of claim 1, wherein an emission spectrum of the first blue LED chip and an emission spectrum of the second blue LED chip are different.

8. The light source module of claim 1, wherein an emission spectrum of the first blue LED chip and an emission spectrum of the second blue LED chip are the same.

9. The light source module of claim 1, wherein a CCT (correlated color temperature) of the light source module approximately ranges from 2700K to 6500K.

10. The light source module of claim 1, wherein the first LED package and the second LED package are symmetrically and uniformly disposed on the substrate.

11. The light source module of claim 1, wherein a peak wavelength associated with the first phosphor approximately ranges from 510 nm to 590 nm.

12. The light source module of claim 1, wherein a peak wavelength associated with the second phosphor approximately ranges from 591 nm to 660 nm.

13. The light source module of claim 1, wherein a FWHM (full width at half maximum) of each of the first phosphor and the second phosphor approximately ranges from 60 nm to 160 nm.

14. A light source module having LEDs and a total light flux, F_module, the light source module comprising:

a substrate;

at least one first LED package disposed on the substrate, the first LED package comprising:

a first blue LED chip emitting light that is in the range of the wavelength for blue light;

a first phosphor for converting the wavelength of a portion of the light emitted from the first blue LED chip; and at least one second LED package disposed on the substrate, the second LED package comprising:

a second blue LED chip emitting light that is in the range of the wavelength for blue light; and a second phosphor for converting the wavelength of a portion of the light emitted from the second blue LED chip;

wherein the wavelength associated with the second phosphor is greater than the wavelength associated with the first phosphor;

wherein a number of the at least one first LED packages is m, and a number of the at least one second LED packages is n, wherein m and n are both positive integers;

wherein each of the first LED packages emits a first light flux F1, and each of the second LED packages emits a second light flux F2;

wherein the total light flux of the light source module, F_module, is a sum of the first light flux F1 multiplied m and the second light flux F2 multiplied by n;

wherein an arithmetic mean of an equivalent light flux of the light source module, F_mean is the total light flux of the light source module F_module divided by a sum of m and n;

wherein the first light flux F1, the second light flux F2, the number m of the first LED packages, and the number n of the second LED packages are chosen to optimize the equivalent light flux F_mean;

wherein a plurality of first CIE (CIE chromaticity diagram) coordinate points are provided based on different ratios of the first phosphor, a first line is drawn by the first CIE coordinate points, and the first line is substantially straight;

wherein a plurality of second CIE (CIE chromaticity diagram) coordinate points are provided based on different ratios of the second phosphor, a second line is drawn by the second CIE coordinate points, and the second line is substantially straight;

wherein a slope of the first line is fixed and a slope of the second line is fixed.

15. The light source module of claim 14, wherein the slope of the first line is greater than the slope of the second line.

16. The light source module of claim 15, wherein a total light flux of the first LED packages is higher than a total light flux of the second LED packages.

17. The light source module of claim 15, wherein the first LED packages and the second LED packages are symmetrically and uniformly disposed on the substrate.

18. The light source module of claim 15, wherein a peak wavelength associated with the first phosphor approximately ranges from 510 nm to 590 nm, wherein a peak wavelength associated with the second phosphor approximately ranges from 591 nm to 660 nm.

* * * * *